(12) United States Patent
Cabral, Jr. et al.

(10) Patent No.: US 7,998,842 B2
(45) Date of Patent: Aug. 16, 2011

(54) ATOMIC LAYER DEPOSITION METALLIC CONTACTS, GATES AND DIFFUSION BARRIERS

(75) Inventors: Cyril Cabral, Jr., Ossining, NY (US); Hyungjun Kim, Lagrangeville, NY (US); Stephen M. Rossnagel, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 148 days.

(21) Appl. No.: 11/214,211

(22) Filed: Aug. 29, 2005

(65) Prior Publication Data

US 2006/0003557 A1    Jan. 5, 2006

Related U.S. Application Data

(62) Division of application No. 10/643,534, filed on Aug. 19, 2003, now Pat. No. 6,943,097.

(51) Int. Cl.
*H01L 21/285* (2006.01)
(52) U.S. Cl. ........ 438/485; 438/513; 438/538; 438/565; 438/569; 438/655; 438/682; 438/683; 438/685
(58) Field of Classification Search .................. 438/485, 438/513, 538, 565, 655, 656, 664, 682, 683, 438/685, 785, FOR. 360, 569
See application file for complete search history.

(56) References Cited

U.S. PATENT DOCUMENTS

| 6,068,016 | A | 5/2000 | Manofsky et al. | |
|---|---|---|---|---|
| 6,096,630 | A | 8/2000 | Byun et al. | |
| 6,140,230 | A | 10/2000 | Li | |
| 6,518,167 | B1 | 2/2003 | You et al. | |
| 6,727,592 | B1* | 4/2004 | Woo et al. | 257/762 |
| 6,734,051 | B2 | 5/2004 | Basceri et al. | |
| 6,737,716 | B1 | 5/2004 | Matsuo et al. | |
| 6,849,545 | B2 | 2/2005 | Mak et al. | |
| 6,861,349 | B1* | 3/2005 | Lopatin et al. | 438/627 |
| 2002/0197863 | A1* | 12/2002 | Mak et al. | 438/679 |
| 2003/0075753 | A1* | 4/2003 | Chu et al. | 257/308 |
| 2003/0170983 | A1 | 9/2003 | Basceri et al. | |
| 2004/0009336 | A1* | 1/2004 | Marcadal et al. | 428/210 |
| 2004/0067641 | A1* | 4/2004 | Yudovsky | 438/680 |
| 2005/0072498 | A1* | 4/2005 | Begg | 148/562 |
| 2005/0087876 | A1* | 4/2005 | Cohen et al. | 257/758 |

* cited by examiner

*Primary Examiner* — N Drew Richards
*Assistant Examiner* — Joannie A Garcia
(74) *Attorney, Agent, or Firm* — Scully, Scott, Murphy & Presser, P.C.; Louis J. Percello, Esq.

(57) ABSTRACT

The present invention provides metallic films containing a Group IVB or VB metal, silicon and optionally nitrogen by utilizing atomic layer deposition (ALD). In particularly, the present invention provides a low temperature thermal ALD method of forming metallic silicides and a plasma-enhanced atomic layer deposition (PE-ALD) method of forming metallic silicon nitride film. The methods of the present invention are capable of forming metallic films having a thickness of a monolayer or less on the surface of a substrate. The metallic films provided in the present invention can be used for contact metallization, metal gates or as a diffusion barrier.

6 Claims, 4 Drawing Sheets

ATOMIC LAYER DEPOSITION METALLIC CONTACTS, GATES AND DIFFUSION BARRIERS

RELATED APPLICATIONS

This application is a divisional of U.S. application Ser. No. 10/643,534, filed Aug. 19, 2003 now U.S. Pat. No. 6,943,097.

FIELD OF THE INVENTION

The present invention relates to the fabrication of a metallic film, and more particularly to the formation of a metallic film using atomic layer deposition (ALD). The metallic films that are formed in the present invention can be used for contact metallization, a metal gate or as a conductive diffusion barrier depending upon the elements present in the metallic film as well as the materials surrounding the metallic film. In particular, the present invention provides a plasma enhanced ALD method and a low temperature thermal ALD method for fabricating conformal metallic films having a thickness of about 100 Å or less on a surface of a substrate.

BACKGROUND OF THE INVENTION

In the semiconductor industry, $TaSi_xN_y$ films have been extensively studied as a barrier layer for Cu interconnects and as a bottom electrode for DRAM capacitors. Such films typically exhibit low resistivity and excellent thermal/chemical stability against high temperature processing. $TaSi_xN_y$ films have been reported in the literature to be excellent copper diffusion barriers up to 900° C.

In addition to applications as a barrier layer or as a bottom electrode, $TaSi_xN_y$ films have recently been investigated as a metal gate electrode due to their good thermal stability and appropriate work functions for n-type metal-oxide semiconductor devices.

With decreasing semiconductor device dimensions, a highly conformal diffusion barrier deposition is required. Additionally, for metal gate electrode purposes, a low damage deposition method is needed. For this, the sputtering of $TaSi_xN_y$ films is not an adequate technique since sputtering typically does not provide sufficient conformality. In sputtering, a target(s) of the desired material(s) is bombarded with excited ions that knock atoms from the target(s). These atoms are then deposited on a surface. Thus, the sputtering mechanism makes it difficult to provide highly conformal diffusion barriers in high aspect ratio applications and dielectric damage free gate electrodes.

Alternative techniques such as chemical vapor deposition (CVD) have been employed in forming $TaSi_xN_y$ films. In a typical CVD process, a solid film is formed through a chemical reaction, e.g., pyrolysis, photolysis, reduction, oxidation or reduction and oxidation (redox), of a gas mixture. A wafer surface or its vicinity is heated to high temperatures in order to provide additional energy to the system. CVD can be problematic in that it exhibits one of the following drawbacks: poor conformality; excessive silicon consumption; high preparation and growth temperatures; and selectivity loss.

In view of the state of the art mentioned above, there is a need for providing a deposition method that is capable of forming metallic films with high conformality, low growth temperatures, easily controlled thickness, atomic layer composition, large area uniformity, low impurity content, minimal dielectric damage and little or no silicon consumption.

There is also a need for providing thin metallic films, on the order of a few monolayers or less, which can be used in fine feature applications.

SUMMARY OF THE INVENTION

The present invention relates to the atomic layer deposition of metallic films that are useful for contact metallization, a diffusion barrier layer or a metal gate of a metal oxide semiconductor device. The metallic films of the present invention that are formed by ALD have the formula $MSi_xN_y$ wherein M is a metal selected from Group IVB (i.e., Ti, Zr or Hf) or VB (i.e., V, Nb or Ta) of the Periodic Table of Elements (CAS version); $0<x$; and $0 \leq y$.

In cases in which y is zero, metallic silicides containing no nitrogen are formed and x is limited to $x \leq 2$. The metallic silicides are typically used for contact metallization or as a gate metal. In the other cases in which y is not zero, metallic silicon nitride films are provided that can be used as either a diffusion barrier or as a metal gate.

The metallic films of the present invention are useful as a component of a metal oxide semiconductor (MOS) device. Specifically, and in broad terms, the MOS device comprises:

a substrate which is either semiconducting, insulating, or a stack thereof, and a conformal metallic film of the formula $MSi_xN_y$ wherein M is a metal selected from Group IVB (i.e., Ti, Zr or Hf) or VB (i.e., V, Nb or Ta) of the Periodic Table of Elements (CAS version); $0<x$; and $0 \leq y$ located on a surface of said substrate, said metallic film having a thickness of about 100 Å or less.

The term "conformal" is used throughout the present application to denote a metallic film having a uniform thickness across a substrate, which is capable of following the contour of the substrate and any features contained within the substrate, yet maintain its uniform thickness.

In some embodiments, a conductive material such as Cu, W, Al, Ta, TaN, Ru, Rh, Ti, Be TiN, Ag and the alloys thereof is formed atop the metallic film. In such instances, the metallic film would include nitrogen and thus it would function as a diffusion barrier to the conductive material.

In embodiments wherein y is zero, the metallic silicides are typically formed atop a semiconductor substrate forming a metallic contact or a gate electrode.

The ALD method used in the present invention for forming the metallic silicide is a low temperature thermal ALD process in which deposition occurs at a temperature of about 450° C. or less. In the inventive low temperature thermal ALD method, a substrate is exposed to an alternating exposure of metal precursor and a silicon source. Low temperatures can be used since the chemical reaction between the metallic precursor and the silicon source occurs through surface reactions rather than vapor phase reactions.

Specifically, and in broad terms, the metallic silicides are formed by the steps of:

first exposing a substrate to a first flux of a Group IVB or VB metal precursor to form a condensed and absorbed monolayer or less of said metal precursor on a surface of the substrate; and second exposing the condensed and absorbed monolayer or less to a second flux of a silicon source, wherein said first and second exposing is performed at a substrate temperature of less than 450° C.

The first and second exposing steps may be repeated any number of times to form a conformal metallic film that has a thickness of about 100 Å or less, preferably 50 Å or less and even more preferably 30 Å or less.

The other metallic films of the present invention that include nitrogen are formed by utilizing a plasma enhanced atomic layer deposition (PE-ALD) process. In the inventive PE-ALD process, a Group IVB or VB metallic precursor, a silicon source and an energetic mixture of nitrogen and hydrogen are used.

Specifically, and in broad terms, the metallic films containing a Group IVB or VB metal, silicon and nitrogen are formed by the steps of:

first exposing a substrate to a first flux of a Group IVB or VB metallic precursor or a silicon source to form a condensed and absorbed monolayer or less of said metallic precursor or silicon source on a surface of the substrate; and second exposing the substrate containing the monolayer or less to a second flux of a Group IVB or VB metallic precursor or a silicon source, said second exposing comprising a different flux of material than the first exposing, wherein a flux of nitrogen and hydrogen radicals and ions created by a plasma or thermal source is introduced prior to, or after, the second exposing step.

The first, second and H/N exposing steps may be repeated any number of times to form a conformal metallic film that has a thickness of about 100 Å or less, preferably 50 Å or less and even more preferably 30 Å or less.

It is noted that the low temperature thermal ALD method and the PE-ALD method of the present invention can provide metallic films with high conformality, low growth-temperatures, low impurity content, minimal dielectric damage and little or no silicon consumption. With respect to the impurity content, the methods of the present invention can form metallic films that have an impurity content of about 1% or less, with an impurity content of about 0.5% or less being more typical.

The methods of the present invention can be used to form graded compositions of MSiN and MSi$_2$. The MSi$_x$N$_y$ layer may be graded by varying the x and y values tweaking the nitrogen to hydrogen flow rate to change the nitrogen content and/or changing the Si source exposure time to change Si content for every or a number of desired exposure cycles. In order to improve the adhesion of the ALD materials or to modify the workfunction if being used as a gate metal, metal rich silicides or MSiN may be employed in contact with dielectrics and silicon rich silicides or nitrogen rich MSiN's may be employed in contact with the capping metal.

DETAILED DESCRIPTION OF THE INVENTION

Figure 1:
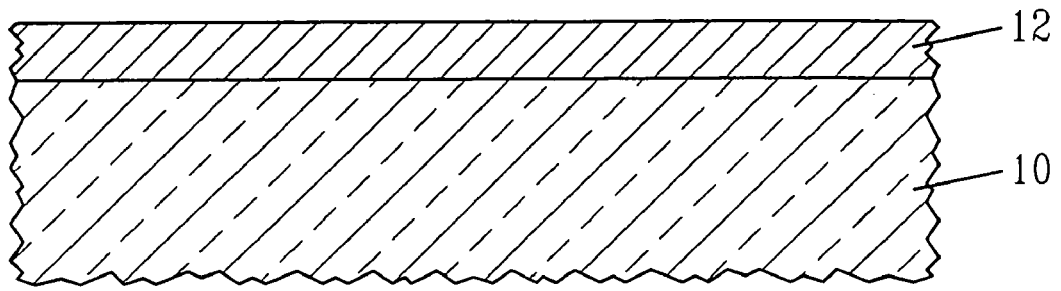
FIG. 1 is a pictorial representation (through a cross-sectional view) showing an MOS device including a metallic silicide contact deposited by the low temperature thermal ALD method of the present invention.

The present invention, which provides a low temperature thermal ALD method of forming Group IVB or VB silicides and a PE-ALD method of forming Group IVB or VB silicon nitrides, will now be described in greater detail by referring to the following discussion. Specifically, the low temperature ALD method will be described in detail first, followed by a detailed discussion of the PE-ALD method.

In either of the methods disclosed below, a substrate such as a semiconductor material, insulator or a stack thereof is placed inside a reactor chamber of an ALD apparatus. Any ALD apparatus can be used. The term "semiconductor material" is used herein to denote a semiconductor material such as Si, SiGe, Ge, GaAs, InAs, InP, SiC, SiGeC, and all other III/V compound semiconductors. The semiconductor substrate may be single crystal, or polycrystalline. Also contemplated with the term "semiconductor" are stacked semiconductors such as silicon-on-insulators, silicon germanium-on-insulators and silicon carbide-on-insulators. The term "insulator" is used in the present invention to denote any electrical insulating material including oxides, nitrides, and oxynitrides. A preferred insulator is SiO$_2$. An example of a stacked substrate that can be utilized in the present invention is SiO$_2$ located on a Si wafer.

In some embodiments, the substrate may be cleaned prior to use to remove any native oxides or other contaminates from the surface thereof. An example of a cleaning process that may be used in the present invention is an HF dip.

Low Temperature Thermal ALD—This method is particularly useful in forming metallic silicides, i.e., y in the formula MSi$_x$N$_y$ is zero. Preferred metal silicides formed in the present invention are the silicides of Ta and Ti. Highly preferred silicides are TiSi$_2$ and TaSi$_2$. The low temperature thermal ALD method of the present invention includes two basic steps: a step of first exposing a substrate to a first flux of a Group IVB or VB metal precursor to form a condensed and absorbed monolayer or less of said metal precursor on a surface of the substrate; and a step of second exposing the condensed and absorbed monolayer or less to a second flux of a silicon source, wherein said first and second exposing is performed at a substrate temperature of less than 450° C.

The low temperature thermal ALD process begins by positioning one of the above-mentioned substrates into a reactor chamber of an atomic layer deposition apparatus. Any conventional design or model may be used. The positioning typically occurs on a sample holder. After the substrate is positioned in the chamber, the pressure within the chamber is pumped to a base pressure of about 1×10$^{-6}$ Torr or less. The preferred working partial pressure of from about 1 mTorr to about 1 Torr is employed in the low temperature thermal ALD method of the present invention.

After obtaining the desired working pressure, the substrate is heated by means of a heating element that is positioned in proximity to the sample holder. Any type of heating element may be used such as, for example, a ceramic resistive heating plate. The substrate is heated to a temperature up to 450° C., more preferably the substrate is heated to a temperature of from about 200° to about 400° C. The temperature can be controlled by varying the current to the heater.

A Group IVB or VB metal precursor in the form of a gas or vapor is then fluxed into the reactor chamber and the substrate is exposed to this flux such that a condensed and absorbed monolayer or less of Group IVB or VB metal precursor is formed on the surface of the substrate. The Group IVB or VB metal precursor is a halogen-containing compound of the formula MX$_a$ wherein M is a Group IVB or VB metal, i.e., Ti, Zr, Hf, V, Nb or Ta, X is a halogen such as Cl, Br, I or a mixture thereof, and a is the valence state of the Group IVB or VB metal i.e., 4 or 5. Illustrative examples of various types of metallic precursors that can be employed in the present invention include, but are not limited to: $TiCl_4$, $TiB_4$, $TiI_4$, $TiCl_2F_2$, $ZrCl_4$, $ZrBr_4$, $ZrI_4$, $HfCl_4$, $HfBr_4$, $HfI_4$, $VCl_5$, $VBr_5$, $VI_5$, $NbCl_5$, $NbBr_5$, $NbI_5$, $TaCl_5$, $TaI_5$, $TaBr_5$ and the like. Of these metallic precursors, $TiCl_4$ and $TaCl_5$ are highly preferred.

The metal precursor may be in the form of a solid, liquid or gas prior to being introduced in the ALD chamber. However, upon entering the chamber a gas or vapor of the same is required. For example, a solid metal precursor can be used and upon applying heat thereto a gas or vapor of the metal precursor is formed. The amount of heat necessary to generate the gas or vapor is dependent on the initial form of the metal precursor as well as the elements that make up the same. When a solid form of the metallic precursor is employed, a temperature of about 90° C. or above is used to generate the gas or vapor. Lower temperatures or no heating are needed when a liquid form of the metallic precursor is used. It is noted that it may be necessary to heat the lines which carrier the metallic precursor gas or vapor to the ALD chamber to prohibit condensation within the lines.

To aide in the delivery of the metallic precursor to the ALD chamber, a carrier gas may be introduced into the line carrying the metallic precursor. The carrier gases employed in the present invention are typically inert gases such as He, Ar, Ne, Xe, Kr and mixtures thereof. A dilution of about 99 to about 99.95% inert gas to about 0.05 to about 1% metallic precursor may be obtained.

The amount of metallic precursor gas or vapor and optionally carrier gas introduced into the ALD reactor is sufficient to form a condensed and absorbed monolayer or less of the metallic precursor on the substrate. Typically, the amount of metallic precursors that are introduced into the ALD chamber are controlled by a leak value or another flow control means. A typically flow rate that can be used in the present invention for the metallic precursor is from about 10 to about 100 sccm, with a flow rate of from about 20 to about 50 sccm being more highly preferred. The time period for this first exposure to the metallic precursor may vary depending on the flow rate and material being introduced in the chamber. Typically, however, the first exposing step is performed for a time period of from about 0.5 to about 5 seconds, with a first exposing time period of from about 1 to about 3 seconds being more highly preferred. Note that during the first exposing step, the substrate is maintained within the temperature range mentioned above.

As stated above, the first exposing step introduces a flux of metallic precursor, in the form of a gas or vapor, into the reactor chamber. The metallic gas or vapor first condenses on the surface of the substrate and then the condensed precursor is absorbed by chemisorption onto the substrate.

After the first exposing step, the chamber may be evacuated to remove non-absorbed metallic precursor from the reaction chamber. If the evacuation step is performed, it is typically performed for a period of time of from about 0.5 to about 10 seconds, with a period of time of from about 1 to about 5 seconds being more highly preferred. The pressure in the reaction chamber during this evacuation step is within, or slightly below, the working pressure mentioned above.

It is also possible to purge the system at this point of the present invention by introducing a flux of inert gas into the reaction chamber. This purge may follow the evacuation step, or if the evacuation step is not performed, the purge may follow the first exposing step. When the inert gas purge is performed, it is typically performed for a time period of from about 0.5 to about 5 seconds, with a time period of from about 1 to about 3 seconds being more highly preferred.

Next, a flux of a silicon source is introduced into the reaction chamber and the silicon source is exposed to the absorbed monolayer or less-containing substrate in a second exposing step. The silicon source employed in the present invention must contain atoms that are capable of reacting with the halogen atoms of the metallic precursor absorbed onto the surface of the substrate and form a free complex therewith that can be removed by evacuation. The Si of the silicon source reacts with the metal remaining on the substrate. The reacted Si can be used in forming an additional monolayer or less thereon by repeating the first exposing and second exposing steps.

One type of silicon source that is capable of achieved the foregoing is a silane having the formula $Si_nH_{2n+2}$ wherein n is from 1 to 10, preferably from 1 to 3. Hence, silane, disilane and trisilane are preferred types of silicon sources that can be employed in the present invention. When a silane is employed, the H reacts with the halogen X forming a non-bonded HX complex that can be removed from the system by evacuation.

The silicon source may be in the form of a solid, liquid or gas prior to being introduced, but upon entering the reaction chamber a gas or vapor is needed. Heat can be used to form a gas or vapor of the silicon source. When heat is necessary to generate the gas or vapor, a temperature at, or above, the melting point and boiling point of the particular silicon source can be employed.

The silicon source may be used as is, or it may be diluted with an inert gas. A typically dilution is from about 0 to about 99.5% inert gas and from about 0.5 to about 100% silicon source. A flow controller or other flow control means is used to control the amount of silicon source being introduced into the reactor chamber. While the flow rate can vary, the flow rate of the silicon source being introduced into the reactor chamber is typically from about 50 to about 500 sccm, with a flow rate of from about 80 to about 300 sccm being more highly preferred. The second exposing step is performed for a sufficient time period to achieve the aforementioned reactions. Specifically, the second exposure step is performed for a time period of from about 1 to about 10 seconds, with a time period of from about 3 to about 7 seconds being more highly preferred.

The processing may be stopped at this time, or further evacuation and purging may be performed. It is also contemplated in the present invention to repeat the above first and second exposing steps any number of times until a desired thickness of the metallic film is achieved. Note that the first and second exposure steps represent one cycle and that the cycle may be repeated any number of times to obtain a desired thickness. Any thickness but preferably up to about 100 Å can be obtained. The low temperature ALD process described above forms metallic silicides such as $TiSi_2$ or $TaSi_2$. The exposure time of each step can be used to tweak the composition of the metallic silicide. The metallic film is conformally grown on the surface of the substrate one monolayer or less at a time. This permits the formation of a uniform thick metallic film across the entire surface of the substrate.

FIG. 1 is a simple illustration of a MOS device including substrate 10 and metallic silicide 12 formed using the low temperature thermal ALD method of the present invention. In this illustration, the metal silicide 12, which serves as a contact, is formed atop a planar substrate. In some embodiments, the metallic silicide may be formed atop a patterned substrate. In yet another embodiment, the silicide and substrate may be patterned after formation of the silicide.

II. PE-ALD—This method is particularly useful in forming metallic silicon nitrides, i.e., y in the formula $MSi_xN_y$ is not zero. Preferred metal silicon nitrides formed in the present invention are $TaSi_xN_y$ and $TiSi_xN_y$. The PE-ALD method of the present invention includes a step of first exposing a substrate to a first flux of a Group IVB or VB metal precursor or silicon source to form a condensed and absorbed monolayer or less thereof on a surface of the substrate; and a step of second exposing the condensed and absorbed monolayer or less to a second flux of either Group IB or VB metal precursor or a silicon source, wherein said first and second flux include different materials. In the PE-ALD process, hydrogen and nitrogen radicals and ions are introduced into the reaction chamber either prior to, or after, the second exposing step. The energetic hydrogen and nitrogen is generated by a plasma or thermal source.

The PE-ALD process begins by positioning one of the above-mentioned substrates into a reactor chamber of an atomic layer deposition apparatus. Any conventional design or model may be used. The positioning typically occurs on a sample holder. After the substrate is positioned in the chamber, the pressure within the chamber is pumped to a base pressure of about $1 \times 10^{-6}$ Torr or less. The preferred working partial pressure of from about 1 mTorr to about 1 Torr is employed in the PE-ALD method of the present invention.

After obtaining the desired working pressure, the substrate is heated by means of a heating element that is positioned in proximity to the sample holder. Any type of heating element may be used such as, for example, a ceramic resistive heating plate. The substrate is heated to a temperature up to 450° C., more preferably the substrate is heated to a temperature of from about 200° to about 400° C. The temperature is controlled by varying the current to the heater.

A Group IVB or VB metal precursor (see above definition) or a silicon source (see above definition) in the form of a gas or vapor is then fluxed into the reactor chamber and the substrate is exposed to this flux such that a condensed and absorbed monolayer or less of Group IVB or VB metal precursor or silicon source is formed on the surface of the substrate. The type of material introduced into the reactor chamber during the first exposing step is dependent on the substrate material. The conditions for the first exposing step may vary depending on whether a metallic precursor or a silicon source is being introduced. Notwithstanding this, the above conditions for the specific material, i.e., metallic precursor and silicon source, used in the low temperature thermal ALD process can be used in the PE-ALD process.

To aide in the delivery, a carrier gas may be introduced into the line carrying the metallic precursor and or silicon source during the first exposing step. The carrier gases employed in the present invention are typically inert gases such as He, Ar, Ne, Xe, Kr and mixtures thereof.

The amount of metallic precursor or silicon source and optionally carrier gas introduced into the ALD reactor during the first exposure step is sufficient to form a condensed and absorbed monolayer or less of the metallic precursor or silicon source on the substrate.

After the first exposing step, the chamber may be evacuated to remove non-absorbed material from the reaction chamber. If the evacuation step is performed, it is typically performed for a period of time of from about 0.5 to about 10 seconds, with a period of time of from about 0.5 to about 5 seconds being more highly preferred. The pressure in the reaction chamber during this evacuation step is within, or slightly below, the working pressure mentioned above.

It is also possible to purge the system at this point of the present invention by introducing a flux of inert gas into the reaction chamber. This purge may follow the evacuation step, or if the evacuation step is not performed, the purge may follow the first exposing step. When the inert gas purge is performed, it is typically performed for a time period of from about 0.5 to about 5 seconds, with a time period of from about 1 to about 3 seconds being more highly preferred.

At this point of the present invention, a flux of energetic nitrogen and hydrogen radicals and ions are typically introduced into the reactor chamber. The energetic nitrogen (typically activated $N_2$) and hydrogen (typically atomic hydrogen) source may be created by a plasma or by a thermal source. Any plasma or thermal source may be employed. Specifically, a container containing a gaseous mixture of nitrogen and hydrogen is provided and a plasma is generated by wrapping a multiple-turn coil around the container. The multiple-turn coil has a RF set at approximately 13.56 MHz. The coil is connected such that a power from about 200 to about 1200 Watts is applied to the coil via the power source. Optical emission microscopy or another like means may be used to monitor the generation of the energetic material.

The energetic material is introduced at a flow rate of from about 20 to about 200 sccm, with a flow rate of from about 50 to about 150 sccm being more highly preferred. The exposure time of the energetic material may vary, but typically the exposure time is from about 1 to about 10 seconds, with an exposure time of from about 3 to about 7 seconds being more highly preferred.

A flux of either a metallic precursor (see above definition) or a silicon source (see above definition) is introduced into the reaction chamber and the introduced material is exposed to the absorbed monolayer or less-containing substrate in a second exposing step. The specific material being added in the second exposing step is different from the first exposing step. Thus, for example, if a metallic precursor is used in the first exposing step, a silicon source is required in the second exposing step. Likewise, when the first exposing step employs a silicon source, the second exposing step is required to use a metallic precursor. If the cycle is not followed, a monolayer or less of the metal silicide nitride will not be obtained.

The conditions and times for the second exposing step are dependent on the material used. Notwithstanding this, the above mentioned exposing conditions used in the low temperature thermal ALD method for the specific component may also be used here for the PE-ALD method The processing may be stopped at this time or further evacuation and purging may be performed. If the energetic nitrogen and hydrogen material was not previously introduced into the reactor chamber prior to the second exposing step, it may be introduced here after the second exposing step has been completed. The point at which energetic nitrogen and hydrogen are added will determine the composition and hence resistivity of the deposited film.

It is also contemplated in the present invention to repeat the above first, second and energetic nitrogen/hydrogen exposing steps any number of times until a desired thickness of the metallic film is achieved. Note that the first, second and energetic nitrogen/hydrogen exposing steps represent one cycle and that the cycle may be repeated any number of times to obtain a desired thickness. Any thickness but preferably up to about 100 Å can be obtained. The PE-ALD process described above forms metallic silicon nitrides such as TiSiN, ZrSiN, HfSiN, TaSiN, NbSiN or VSiN The exposure time of each step can be used to tweak the composition of the metallic silicon nitride. The metallic film is conformally grown on the surface of the substrate one monolayer or less at a time. This permits the formation of a uniform thick metallic film across the entire surface of the substrate.

Figure 2A:
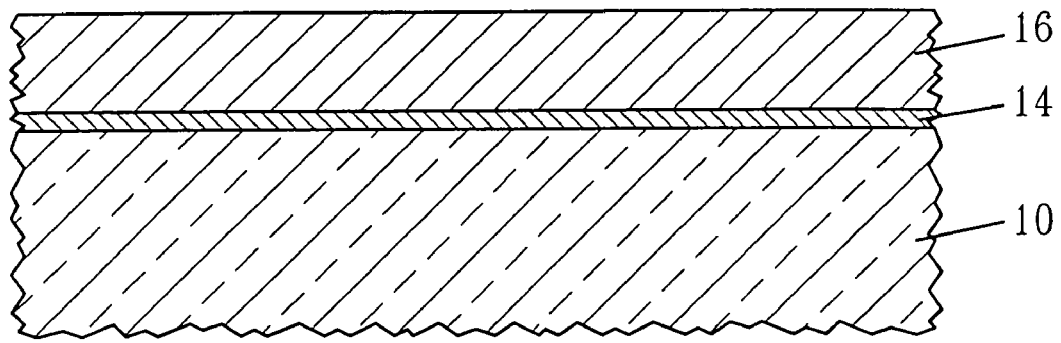
FIGS. 2A-B are a pictorial representation (through a cross-sectional view) showing (A) an MOS device including a metallic film containing a Group IVB or VB metal, silicon and nitrogen as a diffusion barrier; and (B) an MOS device including a metallic film containing a Group IVB or VB metal, silicon and nitrogen as a metal gate.

FIG. 2A is a simple illustration of a MOS device including substrate 10, metallic silicon nitride 14 atop substrate 10, and conductive layer 16 atop metallic silicon nitride 14. The conductive layer may comprise a conductive metal such as W, Al, Cu, Ta, TaN, Ru, Rh, Ti Be, Ag and alloys thereof. Layer 14 is formed using the PE-ALD method of the present invention. In this illustration, the metallic silicon nitride is formed atop a planar substrate. In some embodiments, the metallic silicon nitride may be formed within or atop a patterned substrate.

Figure 2B:
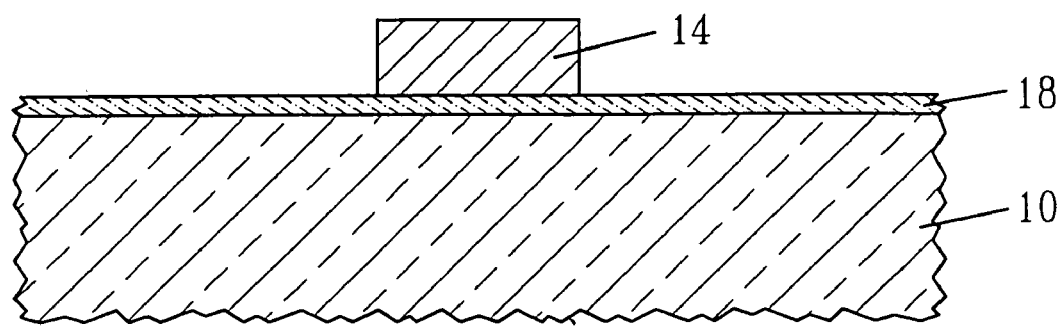

FIG. 2B is a simple illustration of a MOS device including substrate 10, gate dielectric 18 and metallic silicon nitride 14 atop gate dielectric 18. The gate dielectric may comprise any insulator material including oxides, nitrides, oxynitrides and mixtures thereof. Layer 14 is formed using the PE-ALD method of the present invention.

The following examples are provided to illustrate the atomic layer deposition methods of the present invention as well as some advantages that can be obtained therefrom.

Example 1

Atomic Layer Deposition of $TaSi_2$

For this experiment, an atomic layer deposition chamber was used. Samples sizes as large as 200 nm diameter could be loaded with the atomic layer deposition chamber. After the sample was loaded, the chamber was pumped by a reactive gas turbo molecular pump with a working base pressure of $10^{-6}$ Torr. The sample heating was performed using a ceramic resistive heating plate, providing growth temperatures up to 450° C. The temperature was controlled by varying current to the heater, which was previously calibrated against a thermocouple attached to a sample.

Solid $TaCl_5$ (powder) contained in a glass tube was used as the metal precursor. The glass tube was maintained at 100° C. to develop adequate vapor pressure and all the delivery lines were heated between 130°-150° C. to prohibit condensation of the precursor. To improve the delivery, Ar was used as a carrier gas and the flow was controlled by a leak valve upstream from the source tube. Silane, 3% diluted in Ar, was delivered through a mass controller; however, the dilution of silane or the use of other hydride sources including disilane of tri-silane did not change the results.

The deposition cycle consisted of the following steps: exposing a substrate to $TaCl_5$ carried by Ar gas for a time $t_{TaCl2}$, evacuating the chamber, opening the silane source valve for a given time and shutting of the valve. No purging gas was used between halide and silane exposure, but using the purging gas does not alter the results. During silane exposure, the gate valve between the chamber and the turbo pump was closed to obtain the highest possible source of silane. Films were deposited on HF-dipped Si (001) or 500 Å $SiO_2$ thermally grown on a Si substrate. No significant substrate dependency was observed for growth of $TaSi_2$ thin films by atomic layer deposition. In this process, no plasma was applied, but a plasma could be applied to the silane or an additional H plasma cycle could be used.

Figure 3:
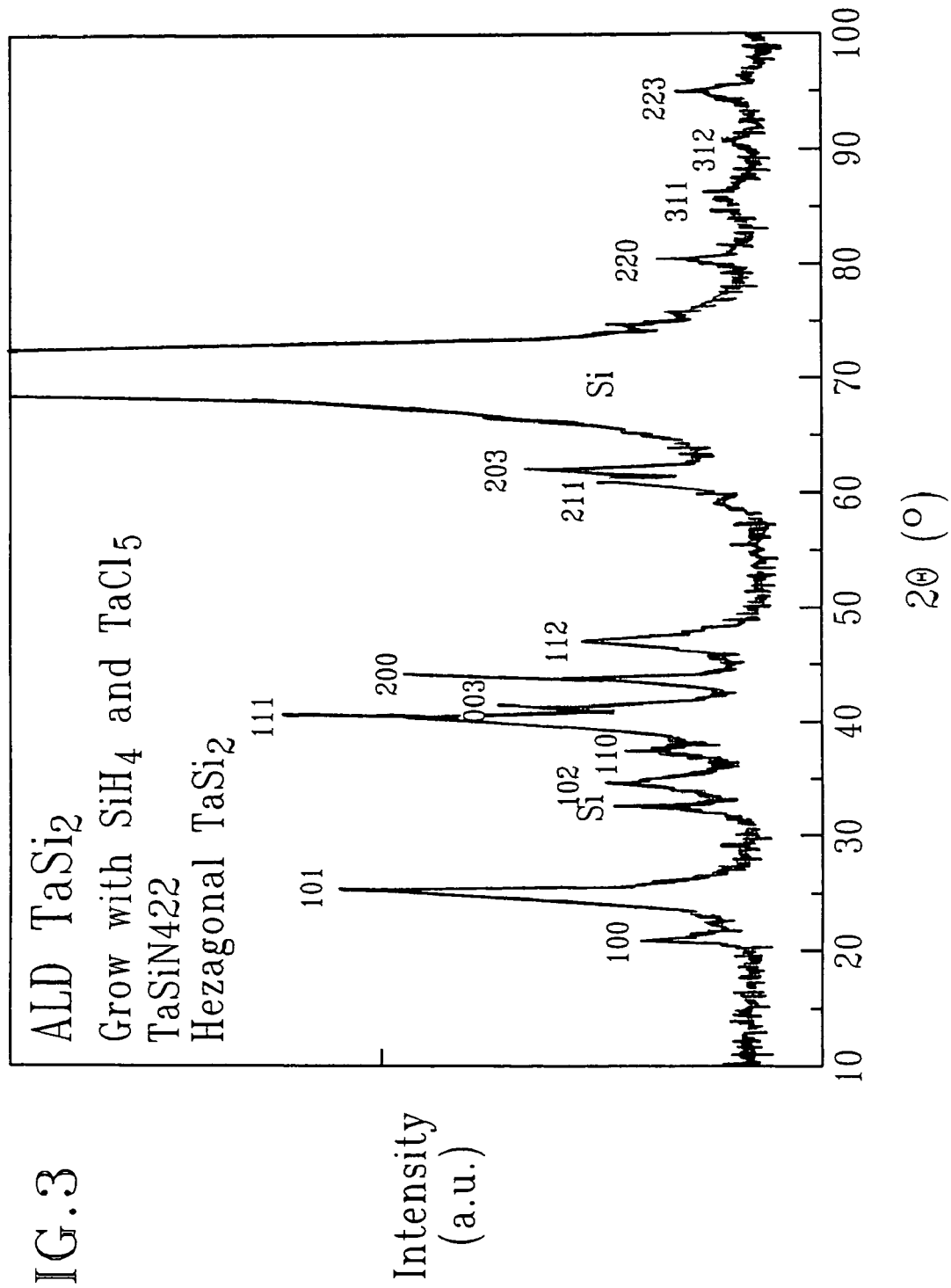
FIG. 3 is an X-ray diffraction (XRD) pattern for the TaSi$_2$ film formed in Example 1.

The grown films were analyzed by Rutherford backscattering (RBS) and X-ray diffraction (XRD). FIG. 3 shows the XRD pattern for a film grown at 300° C. There are no other peaks observed except those from $TaSi_2$ and the Si substrate. This indicates that at the given conditions, the film formed is entirely Ta disilicide without formation of other silicide phases such as the monosilicide phase. The Cl and O concentration were below detection limits of RBS and the H concentration was only 0.4%. By assuming bulk density, the growth rate was 0.46 Å/cycle.

Example 2

Atomic Layer Deposition of TaSiN

For this experiment, a plasma-enhanced atomic layer deposition chamber was used. Samples sizes as large as 200 nm diameter could be loaded with the atomic layer deposition chamber. After the sample was loaded, the chamber was pumped by a reactive gas turbo molecular pump with a working base pressure of $10^{-6}$ Torr. The sample heating was performed using a ceramic resistive heating plate, providing growth temperatures up to 450° C. The temperature was controlled by varying current to the heater, which was previously calibrated against a thermocouple attached to a sample.

Solid $TaCl_5$ (powder) contained in a glass tube was used as the metal precursor. The glass tube was maintained at 100° C. to develop adequate vapor pressure and all the delivery lines were heated between 130°-150° C. to prohibit condensation of the precursor. To improve the delivery, Ar was used as a carrier gas and the flow was controlled by a leak valve upstream from the source tube.

Atomic hydrogen and activated $N_2$ were generated by a quartz tube connected to the sample chamber via a gate valve and hydrogen and nitrogen gases were supplied via a leak valve. The quartz tube was wrapped with a multiple-turn coil set at 13.56 MHz with a power level up to 1200 W. In this example, the gate valve was used between the sample chamber and the tube region such that the precursor was not exposed to the tube region. Optical emission spectroscopy was used to monitor the generated radicals. Large atomic H peaks were observed for the H plasma, while only $N_2^+$ related peaks for the N plasma, indicating that the active precursor for N is activated molecular nitrogen rather than atomic nitrogen. This difference between H and N is probably due to the higher dissociation energy of molecular nitrogen.

The deposition cycle consisted of the following steps: exposing a substrate to $TaCl_5$ carried by Ar gas for a time $t_{TaCl2}$, evacuating the chamber, opening the hydrogen and nitrogen source valves and initiating an RF plasma for a set time $t_p$ and shutting of the hydrogen and nitrogen sources and the plasma, and allowing the chamber to return to base pressure. Before the cycle began, the partial pressure of hydrogen and nitrogen were set using the leak valves. This cycle ideally resulted in the complete reaction of the adsorbed $TaCl_5$ layer, and the deposition of a fraction of a monolayer or less of TaN. For TaSiN deposition, silane exposure without a plasma was performed either before of after the H/N plasma for 5 seconds. During silane exposure, the gate valve between the chamber and turbo pump was closed to obtain the highest possible exposure of silane. Films were deposited on HF-dipped Si (001) or 500 Å $SiO_2$ thermally grown on a Si substrate. No significant substrate dependency was observed for the growth of TaSiN thin films by plasma-enhanced atomic layer deposition (PE-ALD).

Figure 4:
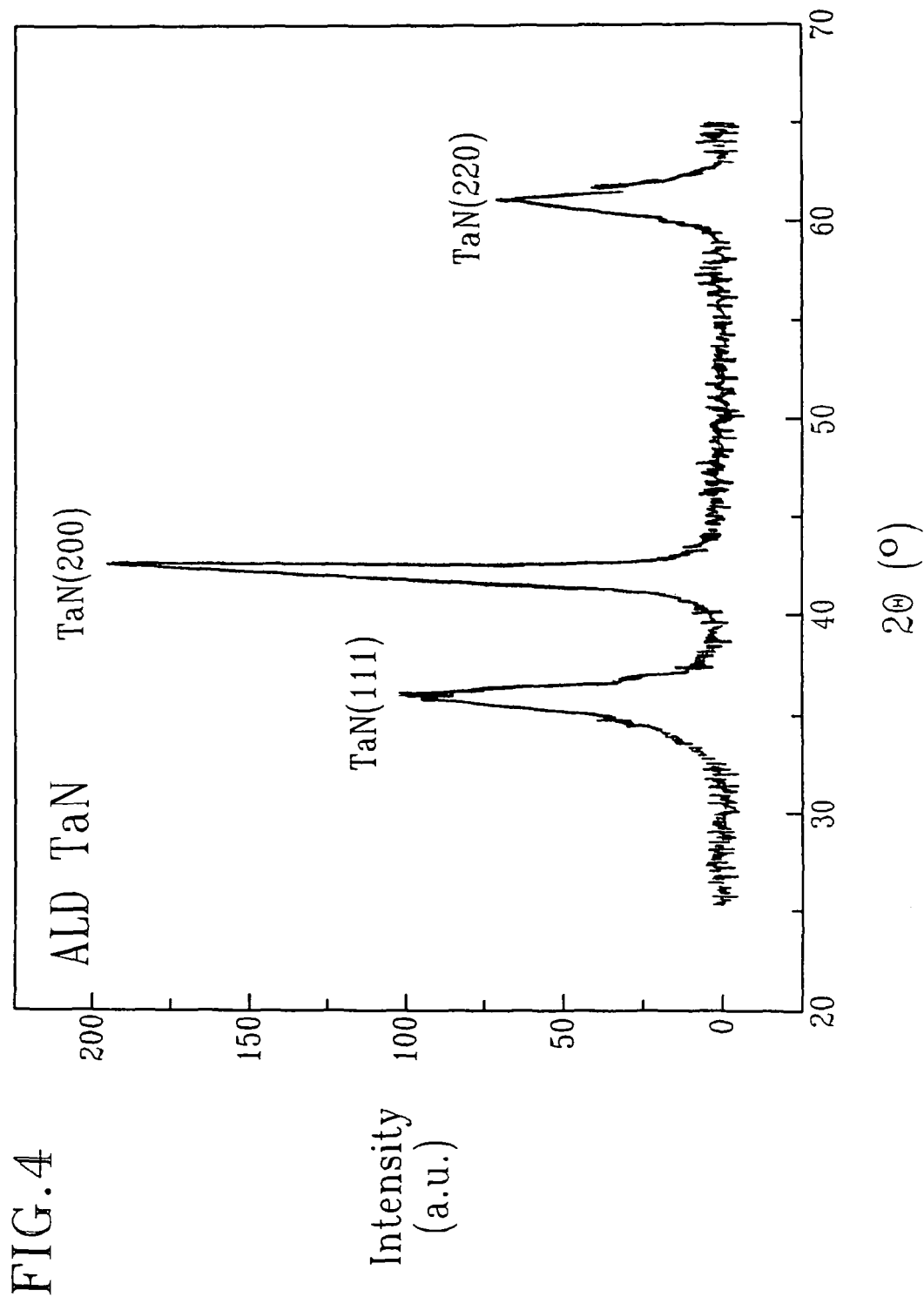
FIG. 4 is an XRD pattern for a prior art TaN PE-ALD film mentioned in Example 2.

FIG. 4 shows the typical XRD pattern of TaN PE-ALD films grown by the same chamber at a growth temperature of 300° C. with a nitrogen/hydrogen partial pressure of 0.03. Clearly, the cubic TaN peaks are observed and RBS results indicate that the films are stoichiometric at the given condition. Transmission electron microscopy (TEM) results indicated that the film is composed of polycrystalline cubic TaN phase. The films were able to be grown at temperatures as low as room temperature although the contamination level was a function of growth temperature. The Cl, which is the main contaminant, was below 0.5% at typical growth conditions. No detectable C was observed, while the post deposition air exposure produce 5-10% O on the surface region of the film.

Figure 5:
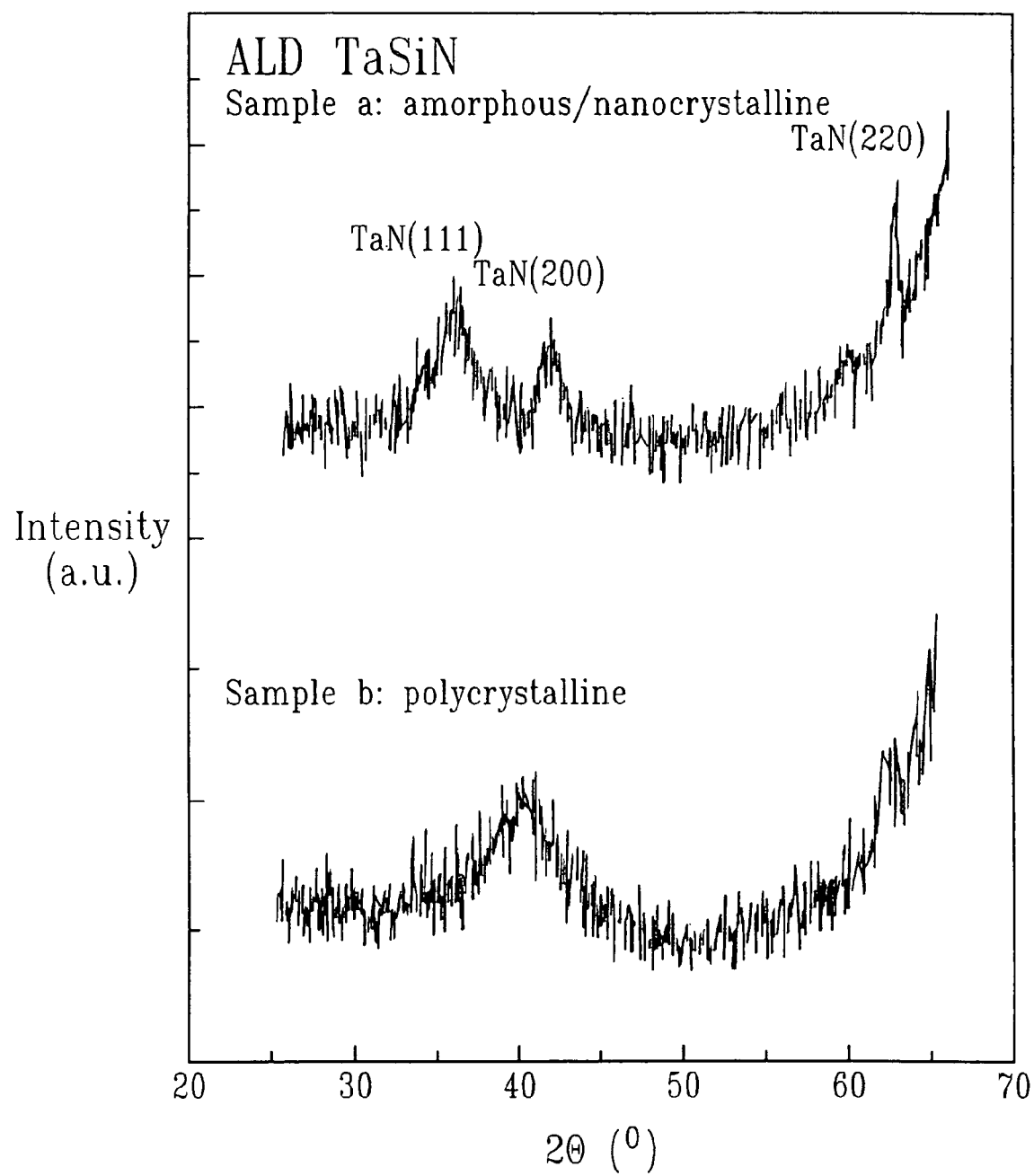
FIG. 5 is an XRD pattern for the inventive TaSiN film formed in Example 2.

FIG. 5 shows the change in XRD pattern by inserting a silane exposure of 5 seconds before of after the H/N plasma exposure. For sample a), which was grown by silane exposure before plasma exposure, the cubic TaN related peaks are gone, resulting in only a broad diffraction feature, indicating that the film was amorphous. This is indicative of the deposition of TaSiN.

The resistivity of sample a) was as high as 106 μΩcm, while that of sample b) was 103 μΩcm, which is the same as the typical plasma vapor deposited TaSiN films. RBS indicates that the composition of sample a) is 13% Ta, 52% N and 35% Si, while that of sample b) was 20% Ta, 25% N and 55% Si. This result indicates that the composition, resistivity and microstructure of ALD grown TaSiN is very much dependent upon growth sequence. Also, a very high Si concentration can be obtained with a range of Si compositions modulated by changing the silane exposure time.

While the present invention has been particularly shown and described with respect to preferred embodiments thereof, it will be understood by those skilled in the art that the foregoing and other changes in forms and details may be made without departing from the scope and spirit of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a IVB or VB metal silicon nitride film comprising:
   positioning a substrate in a chamber having a working pressure ranging from about 1 mTorr to about 1 Torr,
   heating the substrate to a temperature from about 200° C. to about 400° C.,
   first exposing the substrate to first flux of a silicon source to form a monolayer of silicon on a surface of the substrate;
   evacuating the chamber to remove non-absorbed materials of the first flux by pumping the chamber to a pressure ranging from 1 mTorr to 1 Torr;
   introducing a flux of nitrogen and hydrogen radicals and ions created by a plasma or thermal source to the monolayer of silicon on said substrate in the chamber after evacuating the chamber to remove the non-absorbed materials of the first flux; and
   second exposing the substrate containing the monolayer of said silicon to a second flux of a Group IVB or VB metallic precursor using atomic layer deposition to provide the IVB or VB metal silicon nitride film having a graded composition on said surface of said substrate after evacuating the chamber to remove the non-absorbed materials of the first flux, said second exposing comprises a different material than the first exposing flux, wherein the IVB or VB metal silicon nitride film has a thickness of about 100 Å or less.

2. The method of claim 1 wherein the Group IVB or VB metallic precursor of the second exposing step is a halogen-containing Group IVB or VB compound of the formula $MX_a$ wherein M is a Group IVB or VB metal, a is 4 or 5, and X is a halogen.

3. The method of claim 2 wherein the Group IVB or VB metallic precursor is $TiCl_4$ or $TaCl_5$.

4. The method of claim 3 wherein the silicon source of the first exposing step is a silane of the formula $Si_nH_{2n+2}$ wherein n is from 1 to 10.

5. The method of claim 4 wherein the silane is $SiH_4$.

6. The method of claim 2 wherein the Group IVB or VB metallic precursor of the second exposing step comprises $TaCl_5$ and the silicon source of the first exposing step comprises $SiH_4$.

* * * * *